United States Patent [19]

Grant et al.

[11] Patent Number: 5,437,710
[45] Date of Patent: Aug. 1, 1995

[54] CHEMICAL PROCESSING SYSTEM FOR MAINTAINING CONCENTRATION OF SEMICONDUCTOR PROCESSING SOLUTION

[75] Inventors: Robert W. Grant, Excelsior; Richard E. Novak, Plymouth, both of Minn.

[73] Assignee: Submicron Systems Inc., Allentown, Pa.

[21] Appl. No.: 356,048

[22] Filed: Dec. 14, 1994

Related U.S. Application Data

[63] Continuation of Ser. No. 207,232, Mar. 7, 1994, abandoned, which is a continuation of Ser. No. 791,093, Nov. 12, 1991, abandoned.

[51] Int. Cl.$^6$ .............................................. B01D 46/46
[52] U.S. Cl. ........................................ 95/12; 95/273; 134/902
[58] Field of Search ............... 156/345, 642, 646; 134/2, 3, 41, 109, 110, 902, 105; 95/8, 12, 273; 210/662, 749, 758, 900; 422/111

[56] References Cited

U.S. PATENT DOCUMENTS

| | | | |
|---|---|---|---|
| 3,964,957 | 6/1976 | Walsh | 134/902 |
| 4,855,023 | 8/1989 | Clark et al. | 134/902 |
| 4,917,123 | 4/1990 | McConnell et al. | 134/902 |
| 4,917,136 | 4/1990 | Ohmi et al. | 134/902 |
| 4,936,877 | 6/1990 | Hultquist et al. | 95/12 |
| 5,032,218 | 7/1991 | Dobson | 156/345 |
| 5,073,268 | 12/1991 | Saito et al. | 210/651 |
| 5,164,049 | 11/1992 | Clark et al. | 156/642 |
| 5,174,855 | 12/1992 | Tanaka | 156/646 |
| 5,242,468 | 9/1993 | Clark et al. | 134/902 |

OTHER PUBLICATIONS

Article in Dec. 1952 Issue of "Modern Plastics", vol. 30, #4, Fluorocarbons-Face, Fame and Fortune, Author Unknown.

*Primary Examiner*—Joseph W. Drodge
*Attorney, Agent, or Firm*—Cobrin Gittes & Samuel

[57] ABSTRACT

A chemical processing system for generating ultra-pure chemicals near the site of use. The system includes in series a supply of chemical or the site of use which may be a tank or drum and may be a point of use for semiconductor manufacturing, a concentrate sensor, a pump, a filter, a reactor vessel, and an optional heat exchanger, all connected by Kel-F tubing. Sources of pure filtered gas connect to the reactor vessel. An ozone generator can likewise connect to the reactor vessel. An optional isolation coil can likewise connect between the gas source and the reactor vessel.

3 Claims, 5 Drawing Sheets

CHEMICAL PROCESSING SYSTEM FOR MAINTAINING CONCENTRATION OF SEMICONDUCTOR PROCESSING SOLUTION

CROSS REFERENCES TO CO-PENDING APPLICATIONS

This is a continuation of application Ser. No. 08/207,232 filed Mar. 7, 1994, now abandoned, which in turn is a continuation of application Ser. No. 07/791,093; filed Nov. 12, 1991, now abandoned.

BACKGROUND OF THE INVENTION

1. Field of the Invention

The present invention is for a chemical processing system, and more particularly, for processing of ultra-pure chemicals from a drum or tank, and with the use of reactive gases, to form the ultra-pure chemicals.

2. Description of the Prior Art

Present day chemicals used in the manufacturing of semiconductor devices have particle levels that exceed 50 particles per milliliter $>0.5$ um, and have dissolved impurities that exceed 250 ppb. Chemical manufacturers are working to improve these specifications through the use of additional filtration, improved delivery hardware and more stringent purification methods. The chemical manufacturers are upgrading their deionized water systems since the chemical manufacturers add water to the chemicals to adjust composition or use water to manufacture the basic chemical.

In addition, the chemical manufacturers are placing great emphasis on cleaning the containers that will ultimately hold the product, whether the containers are one gallon bottles or 55-gallon drums. The short comings of this approach is that there is ample opportunity to pick up micro-contamination during this extensive manufacturing, storage, packaging and distribution process.

The present invention overcomes the disadvantages of the prior art for the commonly used cleaning. chemicals such as HF, HCL, NHOH and $H_2SO_4$, as there is an alternative path which leads to ultra-pure chemicals. This path will be described in the following paragraph. Peroxide ($H_2O_2$) is notably missing from this list of chemicals and the belief is that ozone ($O_3$) can be substituted for its use to further eliminate sources of metal contamination.

SUMMARY OF THE INVENTION

The general purpose of the present invention is a chemical processing system which relies on the fact that gases can be filtered more efficiently than liquid chemicals. A high quality gas filter attenuates the particle challenge on the upstream side of the filter as compared to the downstream side by a ratio of $10^9$ at a particle level of 0.05 um. The best chemical filter when tested on a low viscosity chemical attenuates the particle level by $10^4$ at a particle size of 0.3 um in the liquid phase. Clearly, there is a significant advantage to filtering gases over liquids.

The present invention also utilizes the fact that deionized water can be obtained with low particle counts and low dissolved ion levels. Filtering water, as compared to filtering chemicals, is relatively easy because of the lack of chemical aggression. Many material choices are available for filtering water, and numerous ultra-filtration schemes exist. Therefore, if gases are filtered, as gases and water is filtered as water, and we combine the two in the proper cell design, chemicals can be formed that are highly pure with very few components between the point-of-use and the point-of-formation.

The present invention can be applied to a number of commonly used chemistries. Hydrofluoric acid, HCl, and $NH_3$ gas are very soluble in water nearly to the 1:1 by weight level. Sulfur trioxide ($SO_3$) gas is available as a liquid in a pressurized cylinder at room temperature with a boiling point of 44° C. This material will combine exothermically with $H_2O$ to form $H_2SO_4$. The oxidant for the RCA cleans will be replaced by very heavily ozonated water. Ozone at the solubility limit will be able to grow clean native oxides from a water solution, and provide a means to achieve hydrophillic surfaces. This will eliminate the aluminum, tin, zinc and phosphorous problem present that $H_2O_2$ is known to have.

The performance of the chemical output streams are expected to reflect the customer's deionized water quality with particulate $<10$ per liter $>0.05$ um, and cations and anions not to exceed 0.3 ppb. Silica will be unaffected by this preparation technique and will reflect the DI water value of $<5$ ppb.

According to one embodiment of the present invention, there is provided a point of use chemical generation apparatus as a system for generating ultrapure chemicals near the site of use, thereby avoiding the prior art issues of contamination as previously discussed. The system lends itself to the building of chemical-for-drum storage, which in turn can be connected to a plant level distribution system or for use in process equipment, such as an automated acid cleaning system. A reactor vessel is constructed of PFA TEFLON. One unique feature of this reactor is that the excess or waste gas is allowed to escape via a hydrophobic membrane in the form of a small filter and housing which has been designed into the top of the reactor. The reactor vessel allows the gas to escape, while not allowing the liquid to escape. This is one usage of the TEFLON gas filter membrane, which allows for the control of the ultra-pure chemical without contributing particulates and metallic contamination from traditional prior art components like relief regulators, float valves, etc. Reactive gas in the form of HCL, NH3, HF, and $O_3$, for example, can be introduced to the water in the reactor to form ultrapure HCL acid, $NH_4OH$ base, HF acid, or Ozonated water. These, of course, are only examples of the most popular used anticipated. Water or, as the recirculation process continues, diluted chemical is caused by the pump to pass through the cylindrical reactor, the heat exchanger, filtration, concentration sensor, and vessel, such as a drum or process tank.

A heat exchanger combines the use of standard tube-in-shell heat exchange design with the use of Kel-F polymer, which is the lowest permeating polymer available and which is compatible with the ultra-pure chemical. One reason that permeation is one of the most important issues, is that the usual sources of chilled water is severely laden with the type of contaminants that one needs to avoid. The Kel-F or PCTFE material will not allow the contaminated water to be absorbed, or to pass through the ultra-pure chemical that is being cooled. PFA, for example, is up to 1000 times more permeable than Kel-F, and is not suitable for a heat exchange surface for ultra-pure chemical/chilled water. The seals on the heat exchanger are also unique in that it is ultrasonically welded, thereby eliminating any O-rings.

The in-line concentration sensor is used to determine when the generation process is done in the case of storage vessel generation. In the on-line situation with an automated acid cleaning devise, the sensor can be used to turn off and on the reactive gas to maintain a certain process control concentration parameter. The concentration sensor works on the principal of electromagnetic eddy-current generation in solutions in the kilohertz frequency range.

The gas box supplies one or several gasses to the recirculating generation system. In some cases, for example, $O_3$ and HCL are used together. The tube connection between the predominantly stainless steel gas box and the TEFLON, at least fluoropolymer, water carrying system is Kel-F. The Kel-F prevents moisture from the air from permeating through the wall of the tube and migrating into the stainless based system and causing corrosion and subsequent gas contamination. The "loop" of Kel-F which allows a greater impedance to gas flow/purge flow, can further protect the stainless system. The reactive gas flows are controlled by fixed orifices in view of the one-line concentration sensor. Also, mass flow devices are unreliable in the long term.

The system has the advantage to draw a side stream for analysis to determine submicron sized particulate, etc. This is accomplished by using a dosing pump, such as that sold by Millipore Corporation, which elevates the fluid pressure sufficiently to suppress bubble formation through the optical particle counter which otherwise could cause false counts.

An ozone generator, used to convert process oxygen to ozone ($O_3$), is constructed of titanium/alumina, and operates on the principal of corona discharge.

The system can be controlled by a microprocessor, or can interface to an existing microprocessor control system.

One significant aspect and feature of the present invention is a chemical processing system for generating ultra-pure chemicals on site. The chemical processing system particularly lends itself to the front-end processing applications of semiconductors.

Another significant aspect and feature of the present invention is a chemical processing system which is compact in physical size, and is readily installable in existing processing facilities.

Having thus described the embodiments of the present invention, it is a principal object hereof to provide a chemical processing system for generating ultra-pure liquid chemicals.

One object of the present invention is to utilize Kel-F materials so as to provide for least contamination of the chemical product, as well as preventing moisture from permeating through the wall into the chemical product.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
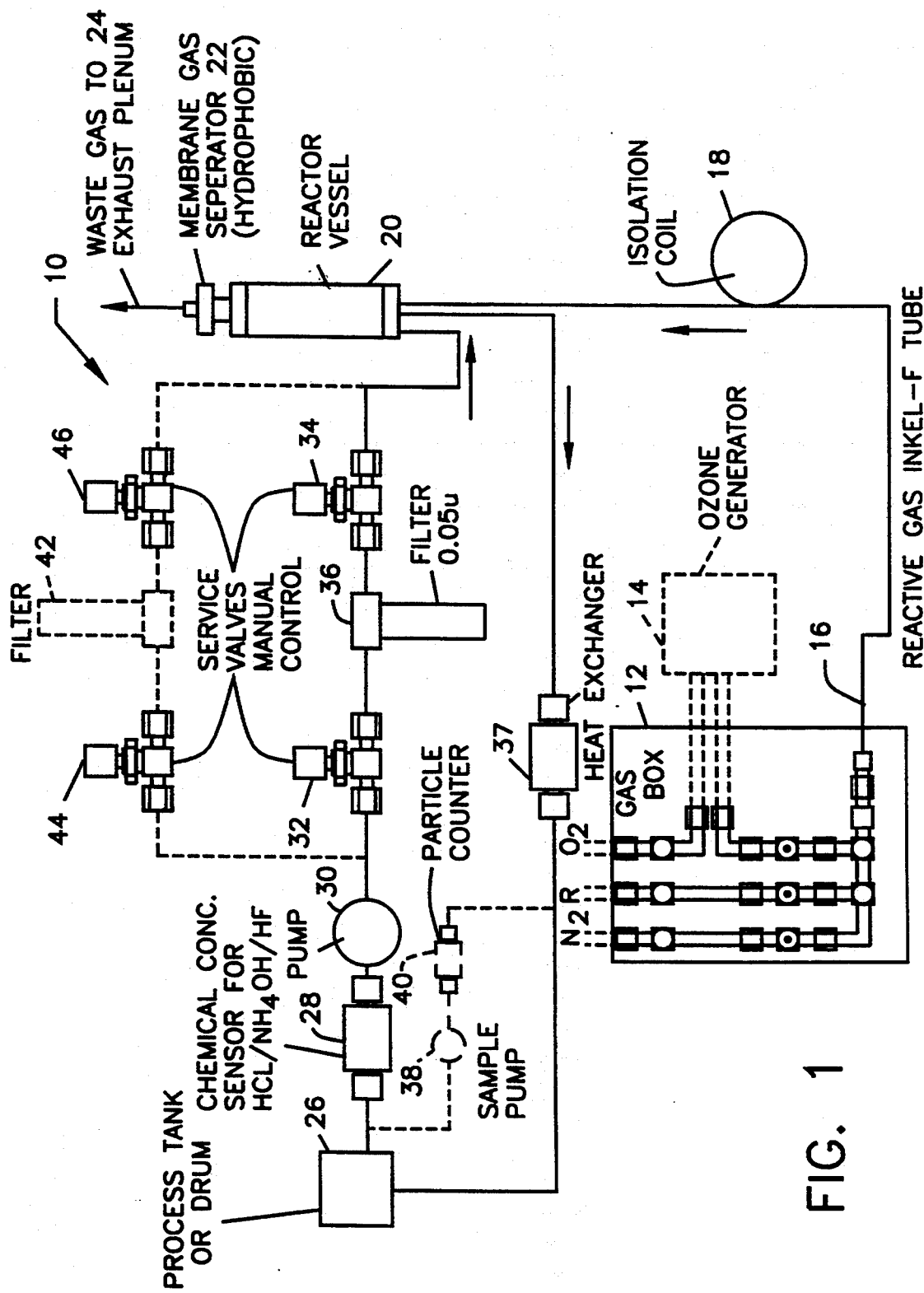
FIG. 1 illustrates a block diagram of the chemical processing system.

FIG. 1 illustrates a block diagram of the chemical processing system 10 including a gas box 12 with a plurality of connections to gas sources, such as nitrogen, R, and oxygen. An ozone generator 14 can connect in series with the oxygen line to generate ozone. The gas box 12 includes the typical valving and piping. The chemical processing system 10 connects to the gas box 12 through Kel-F tubing 16. An isolation coil 18 is provided for isolation purposes. A reactor vessel 20, as later described in detail, is constructed of PFA TEFLON or other suitable materials. The reactor vessel 20 provides waste gas to escape through a hydrophobic membrane, which is in a membrane gas separator 22. An exhaust plenum 24 couples to the membrane gas separator 22 to exhaust waste gases. A drum or process tank 26 connects to a chemical concentrate sensor 28, a pump 30, service valves 32 and 34 with a filter 36 between the two service valves 32 and 34 and feeds into the reactor vessel 20. The output of the reactor vessel 20 connects to the drum or process tank 26 through a heat exchanger 37. An option sample pump 38 and particle counter 40 can connect as illustrated. Likewise an optional filter 42 and service valves 44 and 46 can connect in parallel with the filter 36.

Figure 2A:
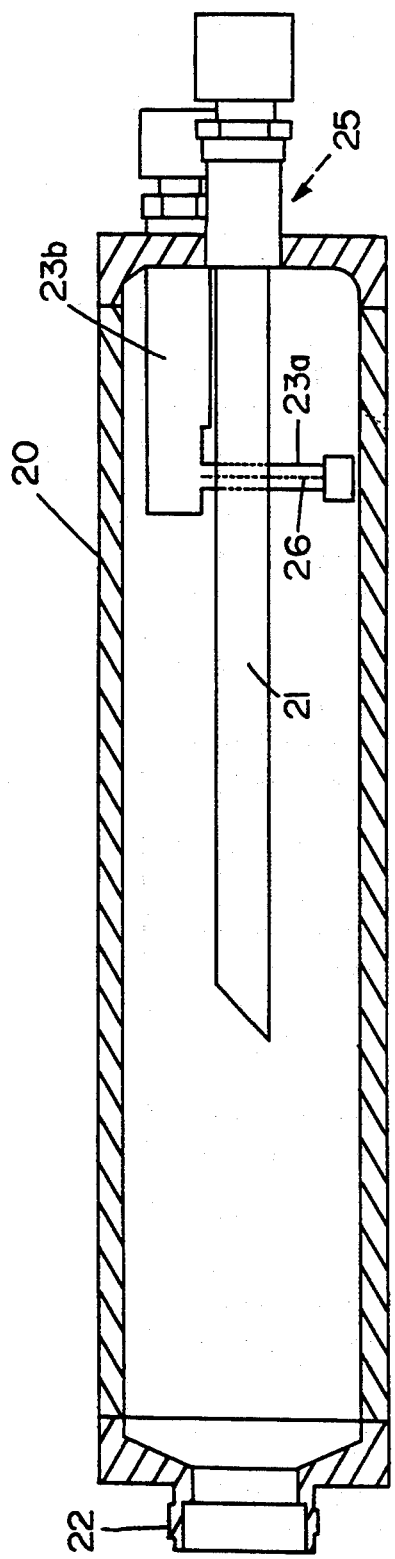
FIG. 2A illustrates a view in cross section of the reactor vessel.
Figure 2B:
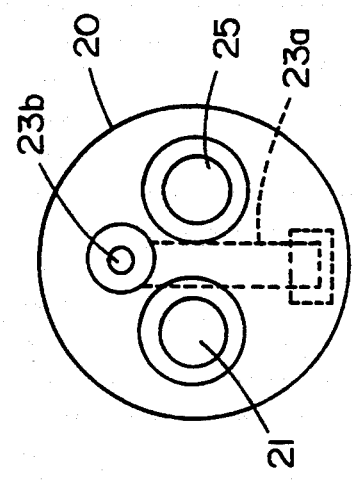
FIG. 2B illustrates an end view of the reactor vessel

FIG. 2A illustrates a view in cross section of the reactor vessel 20, including a hydrophobic membrane gas separator 22 at one end and at the other end a liquid inlet tube 21, a sapphire gas inlet tube 23a, a tube support 23b, and an outlet port 25 also illustrated in FIG. 2B. A predetermined liquid chemical from a process tank or drum 26 enters through the liquid inlet tube 21 and is mixed with the gas transported through the Kel-F tubing 16 and sapphire gas inlet tube 23a. The sapphire gas inlet tube 23a includes a plurality of perforations 26 for the dispensing of gas into the vessel interior. The liquid chemical and gas mixture exists through the outlet port 25 as indicated in FIG. 1.

FIG. 2B illustrates an end view of the reactor vessel where all numerals correspond to those elements previously described.

Figure 2C:
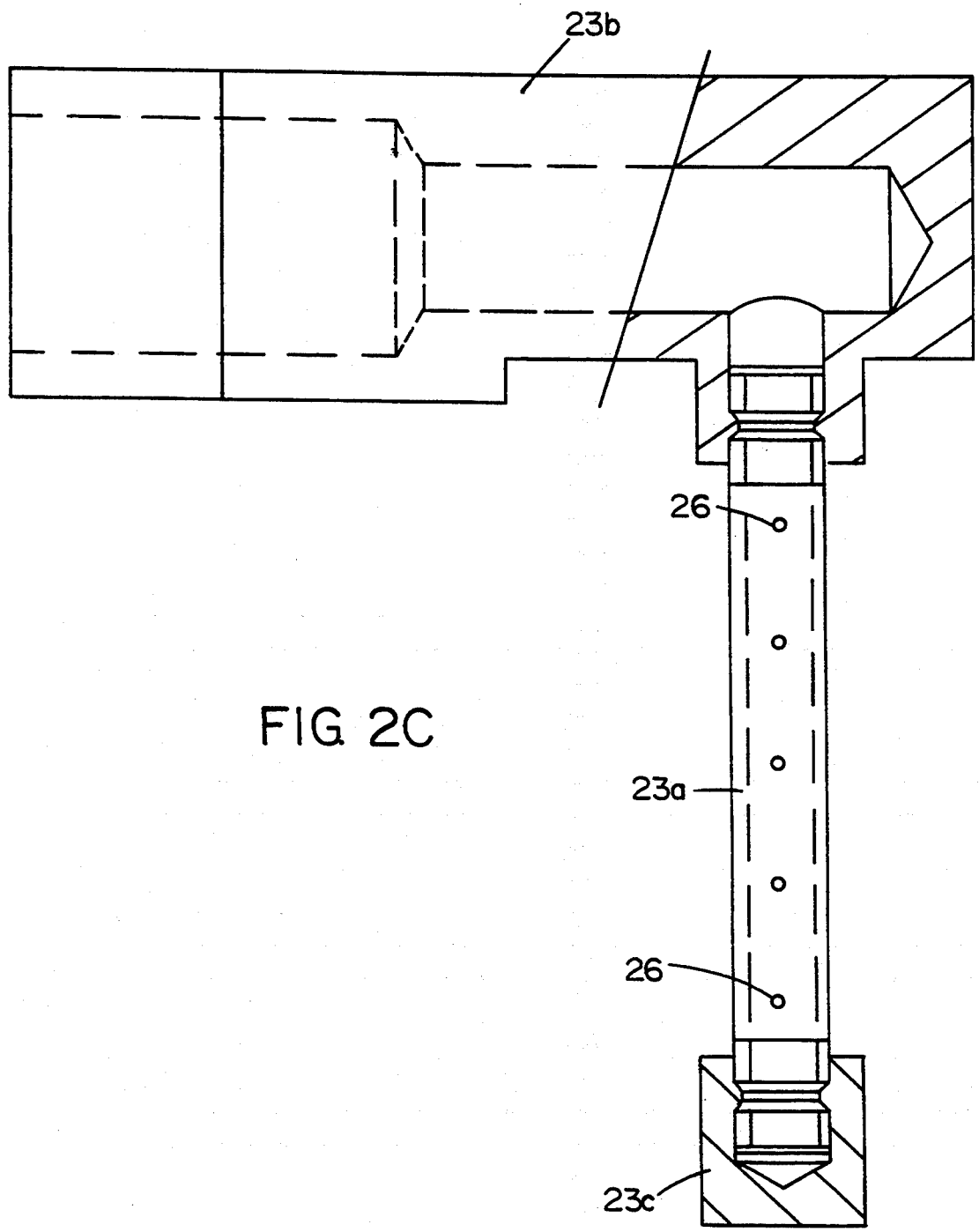
FIG. 2C illustrates a reverse side view in partial cross section of the sapphire gas inlet tube.

FIG. 2C illustrates a reverse side view in partial cross section of the sapphire gas inlet tube 23a and tube support 23b where all numerals correspond to those elements previously described. Gas enters the tube support and is passed outwardly to mix with liquid chemicals through the orifices 26 in the sapphire gas inlet tube 23a. A cap 23c seals the bottom end of the sapphire tube 23a.

Figure 3:
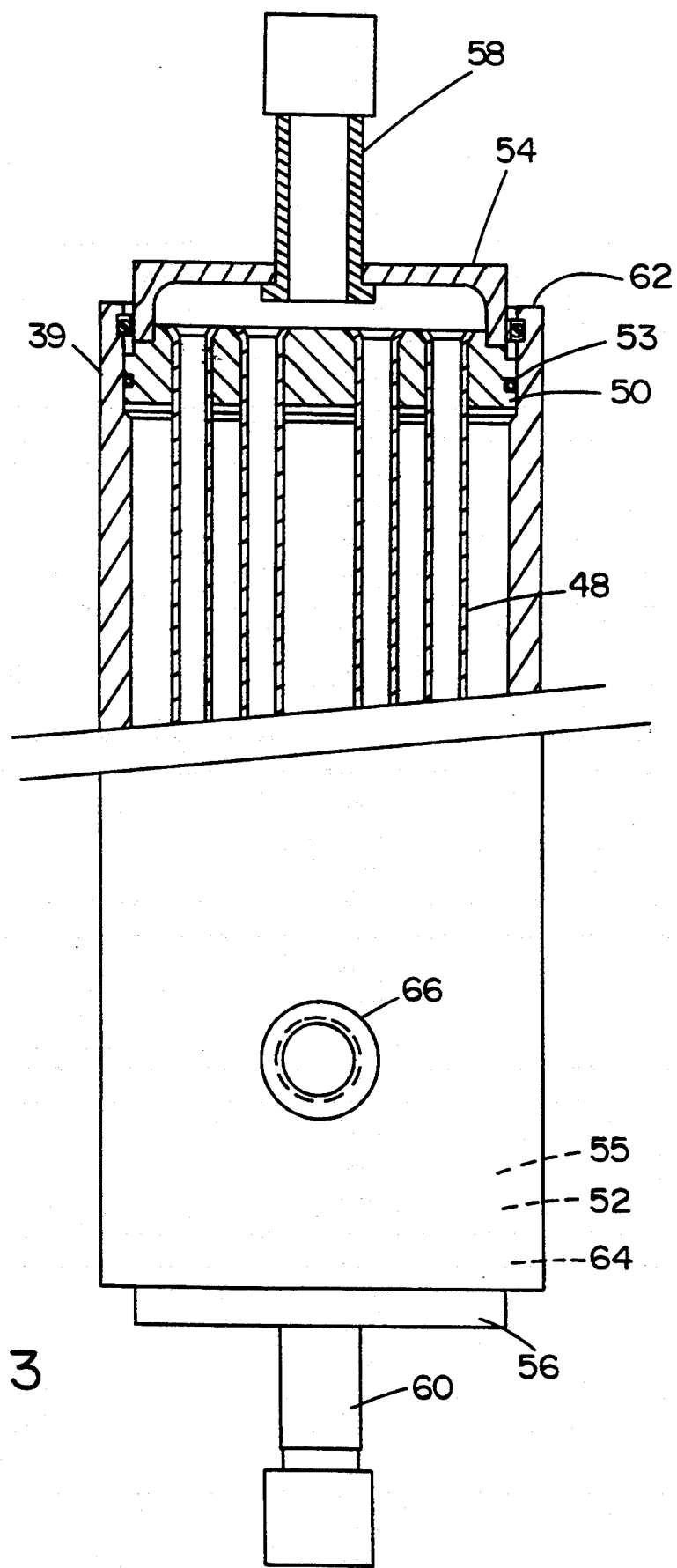
FIG. 3 illustrates a plan view of the heat exchanger.

FIG. 3 illustrates a plan view of the heat exchanger 37. A chilled water jacket 30 surrounds the plurality of Kel-F tubes 48 in the heat exchanger 37, which extend substantially along the length of the chilled water jacket 39. The heat exchanger 37 includes the plurality of Kel-F tubes 48, opposing Kel-F heads 50 and 52 with similar floating seals 53 and 55 at both ends, Kel-F end caps 54 and 56 ultrasonically welded to the heads 50 and 52, and flare fittings 58 and 60 secured to the end caps 54 and 56. Plastic retaining rings 62 and 64 align on the inner surface of the chilled water jacket 37 to retain the Kel-F heads 50 and 52 there within. A cooling water outlet 66 secures to the water jacket 39.

Figure 4:
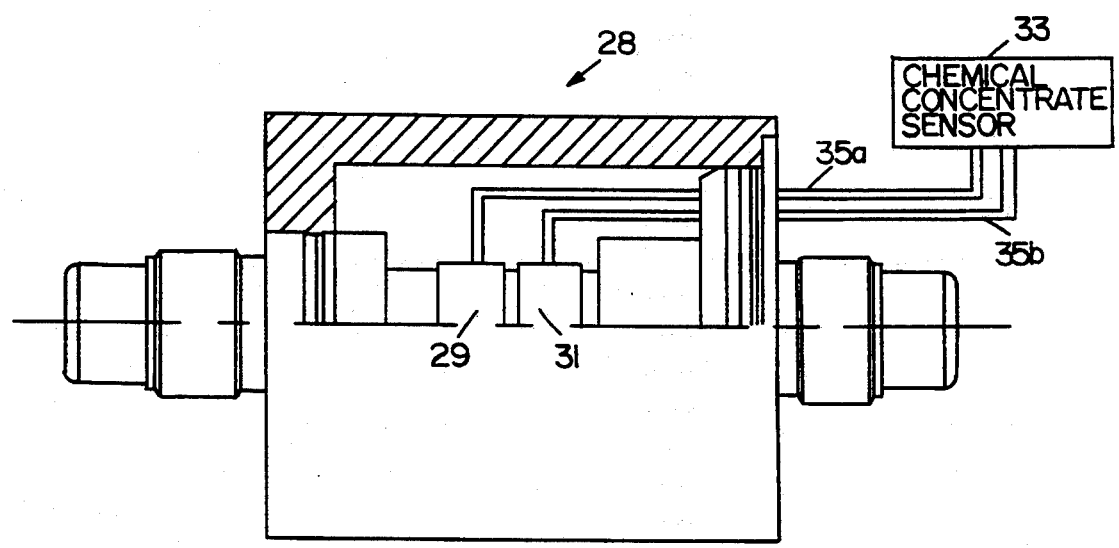
FIG. 4 illustrates a plan view of the chemical concentrate sensor.

FIG. 4 illustrates a plan view of the chemical concentrate sensor 28, including a excitation torroid 29 and a sensing torroid 31 for sensing and determining the concentration of the chemical passing through the sensor. Information from these torroids is carried to a chemical concentrate sensor 33 by cables 35*a* and 35*b*.

MODE OF OPERATION

The chemical processing system 10 is piped and valved with Kel-F tubing 16 for the purity reasons, as well as the permeating reasons, providing for ultrapure chemicals. Further, the Kel-F tubes prevent moisture from the air from permeating through the walls of the tubes and migrating into the system.

Various modifications can be made to the present invention without departing from the apparent scope hereof.

We claim:

1. A method of generating and maintaining the concentration of an ultra-pure chemical solution for semiconductor processing at a given point of use, said method comprising the steps of:
    sensing the concentration of solute in an ultra-pure chemical solution proximate said given point of use;
    providing said solute as a prescribed gas;
    filtering said prescribed gas to provide filtered gas;
    controlling the flow of said filtered gas in response to sensing a change in concentration of said solute in said ultra-pure chemical solution from a preset value to provide controlled filtered gas;
    mixing said controlled filtered gas with chemical solution taken from said
    given point of use to form a maintained concentration ultra-pure chemical solution; and
    transporting said maintained concentration ultra-pure chemical solution to said given point of use.

2. A method as claimed in claim 1, in which the prescribed gas is selected from the group consisting of HCL, $NH_3$, HF and $O_3$.

3. A method as claimed in claim 1, in which said ultra-pure chemical solution is selected from the group consisting of ultra pure HCL acid, $NH_4OH$ base, HF acid and ozonated water.

* * * * *